United States Patent
Auer-Jongepier et al.

(10) Patent No.: US 7,817,241 B2
(45) Date of Patent: Oct. 19, 2010

(54) LITHOGRAPHIC APPARATUS AND DEVICE MANUFACTURING METHOD

(75) Inventors: Suzan Leonie Auer-Jongepier, Valkenswaard (NL); Norbertus Josephus Martinus Van Den Nieuwelaar, Tilburg (NL); Johannes Onvlee, s-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 469 days.

(21) Appl. No.: 11/822,430

(22) Filed: Jul. 5, 2007

(65) Prior Publication Data

US 2009/0009746 A1    Jan. 8, 2009

(51) Int. Cl.
*G03B 27/52* (2006.01)

(52) U.S. Cl. .............. 355/27; 355/53; 355/72; 355/77; 700/100

(58) Field of Classification Search .............. 355/27, 355/53, 72, 77; 414/935; 700/213, 228, 700/245, 253

See application file for complete search history.

(56) References Cited

U.S. PATENT DOCUMENTS

| | | | |
|---|---|---|---|
| 6,879,866 B2 * | 4/2005 | Tel et al. ............. | 700/100 |
| 7,184,849 B2 | 2/2007 | Van Den Nieuwelaar et al. | |
| 7,557,900 B2 * | 7/2009 | Shiraishi ............ | 355/53 |
| 2003/0186546 A1 * | 10/2003 | Wollstein et al. ........ | 438/689 |
| 2004/0069226 A1 * | 4/2004 | Yoshida et al. ......... | 118/715 |
| 2004/0249494 A1 * | 12/2004 | Kobayashi et al. ...... | 700/112 |
| 2005/0058446 A1 * | 3/2005 | Plug ................. | 396/611 |

FOREIGN PATENT DOCUMENTS

WO     WO 2005076323 A1 *    8/2005

* cited by examiner

*Primary Examiner*—Hung Henry Nguyen
*Assistant Examiner*—Colin Kreutzer
(74) *Attorney, Agent, or Firm*—Pillsbury Winthrop Shaw Pittman LLP

(57) ABSTRACT

A lithographic apparatus is disclosed that includes a utility substrate storage configured to hold a utility substrate, and a utility substrate scheduling unit configured to schedule the loading of a utility substrate in a flow of substrates in the lithographic apparatus.

22 Claims, 3 Drawing Sheets

LITHOGRAPHIC APPARATUS AND DEVICE MANUFACTURING METHOD

FIELD

The present invention relates to a lithographic apparatus, a lithographic system, a computer-implemented method and a computer program product to schedule the loading of a utility substrate in a flow of substrates.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithographic systems, a substrate track may be connected directly to the lithographic apparatus. Such a substrate track comprises one or more processing devices, which are configured to (automatically) process substrates. A substrate handler, for instance a substrate robot or an interface unit may be provided to transfer substrates between the substrate track and the lithographic apparatus to introduce a substrate from the substrate track into the lithographic apparatus, and to transfer a substrate, which has been exposed, from the lithographic apparatus to the substrate track.

In a lithographic system, the flow of substrates through the substrate track and the lithographic apparatus is typically designed in such a way that a substrate enters the substrate track at a particular input location, after which the substrate passes one or more processing devices before being transferred to the lithographic apparatus for exposure. Thereafter, the substrate is transferred back to the substrate track where it is taken out of the substrate track after the substrate has passed one or more processing devices. During optimal production there is a continuous flow of substrates through the lithographic system.

SUMMARY

One or more utility substrates, i.e. one or more non-process substrates, such as one or more calibration substrates, one or more dummy substrates, one or more maintenance substrates or one or more closing substrates may be used when the presence of a substrate on a substrate support is desired for another reason than the actual exposure of a pattern on a substrate to avoid the use and waste of process substrates (e.g., wafers used to produce ICs).

For instance, a calibration substrate may be used for calibration of the lithographic apparatus before actual production. A dummy substrate may be used, for instance, during warming up and/or testing of the lithographic system. A maintenance substrate may be loaded on the substrate support used during maintenance. The use of a closing substrate will be explained hereinafter. One or more of the functions as described with respect to a calibration substrate, a dummy substrate, a maintenance substrate and/or a closing substrate may be performed by using one single type of utility substrate. For instance, a closing substrate may also be used as a maintenance or dummy substrate.

In an embodiment of a lithographic apparatus, the lithographic apparatus may comprise an immersion system. In such a lithographic apparatus, a liquid is held, in use, in an immersion space between a substrate being exposed or to be exposed and a final element of the projection system, for instance a lens element. The provision of liquid in this space may substantially improve exposure results. However, after exposure, the substrate support may be moved away from the projection system to exchange the substrate supported on the substrate support for a new one, which when no further measures are taken may result in the liquid captured in the immersion space flowing out of this space since the substrate is typically provided at the bottom side of the immersion space. Different arrangements have been proposed to close the immersion space in order to make movement of the substrate support away from the projection system possible.

One of these arrangements, typically for a lithographic apparatus having two (or more) substrate supports, is that when a first substrate supported by a first substrate support has moved away from the projection system, a second substrate support is moved simultaneously under the projection system while there is a relatively small gap between the first substrate support and the second substrate support. As a result, the liquid in the immersion space is substantially held within the immersion space.

This arrangement may work well for a continuous flow of substrates through the lithographic system. However, a gap may occur in the flow substrates. It may be desirable, for example, that the time in which a substrate is in contact with the liquid be as short as possible. Furthermore, the time between exposure of a substrate and the bake of the substrate in the bake processing device of the substrate track may be critical with respect to the quality of the final product. Therefore, it is undesirable to keep an exposed substrate in the lithographic apparatus in order to avoid that the liquid runs out of the immersion space in case there is a gap in a flow of substrates or when this substrate is at the end of a batch of substrates.

As a possible solution to one or more of these or other problems is to introduce a so-called closing substrate into this system, which closing substrate may fill up a gap in or at the end of a batch of substrates to be exposed by the lithographic apparatus. Such a closing substrate is introduced in the lithographic system at the input location of the substrate track and follows the same path as the process substrates as described above.

A drawback of this solution is that when a gap comes into existence in the lithographic system itself, for instance in the substrate track, it is not possible to introduce a closing substrate in time to close the immersion space without unwanted delay, since the time required to transfer a closing substrate from the input location of the substrate track via the substrate handler to the respective substrate support is too long. Furthermore, one or more substrates of the batch of process substrates may be present between the gap in the flow of substrates and the input location of the substrate track. It is not possible to by-pass these substrates present in the lithographic system. Therefore, the scheduling of the loading of a closing substrate can not always be performed adequately.

The above or similar drawbacks may also apply for the use of other utility substrates, i.e. non-process substrates, such as a calibration, dummy or maintenance substrate in the lithographic system.

It is desirable, for example, to provide a lithographic apparatus and/or system wherein the loading of a utility substrate, such as a closing substrate, may be performed more adequately to increase product quality and/or throughput of the lithographic apparatus or lithographic system.

According to an aspect of the invention, there is provided a lithographic apparatus comprising:

an illumination system configured to condition a radiation beam;

a patterning device support constructed to hold a patterning device, the patterning device being capable of imparting the radiation beam with a pattern in its cross-section to form a patterned radiation beam;

a substrate support constructed to hold a substrate;

a projection system configured to project the patterned radiation beam onto a target portion of the substrate;

a utility substrate storage device configured to hold a utility substrate;

a utility substrate scheduling unit configured to schedule the loading of a utility substrate in a flow of substrates in the lithographic apparatus; and a substrate handler configured to transfer a utility substrate from the utility substrate storage device to the substrate support and/or from the substrate support to the utility substrate storage device.

According to an aspect of the invention, there is provided a lithographic system comprising:

a substrate track comprising one or more processing devices configured to process substrates; and a lithographic apparatus comprising:
a substrate support constructed to hold a substrate,
a utility substrate storage device configured to hold a utility substrate,
a utility substrate scheduling unit configured to schedule the loading of a utility substrate in a flow of substrates in the lithographic apparatus, and
a substrate handler configured to transfer a utility substrate from the utility substrate storage device to the substrate support and/or from the substrate support to the utility substrate storage device;
wherein the substrate handler or a further substrate handler is configured to transfer a substrate between the lithographic apparatus and the substrate track.

According to an aspect of the invention, there is provided a computer-implemented method of scheduling the loading of a utility substrate in a flow of substrates in a lithographic apparatus, comprising:

detecting a gap in the flow of substrates in or towards the lithographic apparatus;

determining whether the loading of a utility substrate in the gap is desired, and when desired, scheduling the loading of a utility substrate in the flow of substrates to fill the gap.

According to an aspect of the invention, there is provided a computer program product to schedule the loading of a utility substrate in a flow of substrates in a lithographic apparatus, comprising:

software code configured to detect a gap in a flow of substrates in or towards the lithographic apparatus;

software code configured to determine whether the loading of a utility substrate in the gap is desired; and software code configured to schedule, when desired, the loading of a utility substrate in the flow of substrates to fill the gap.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
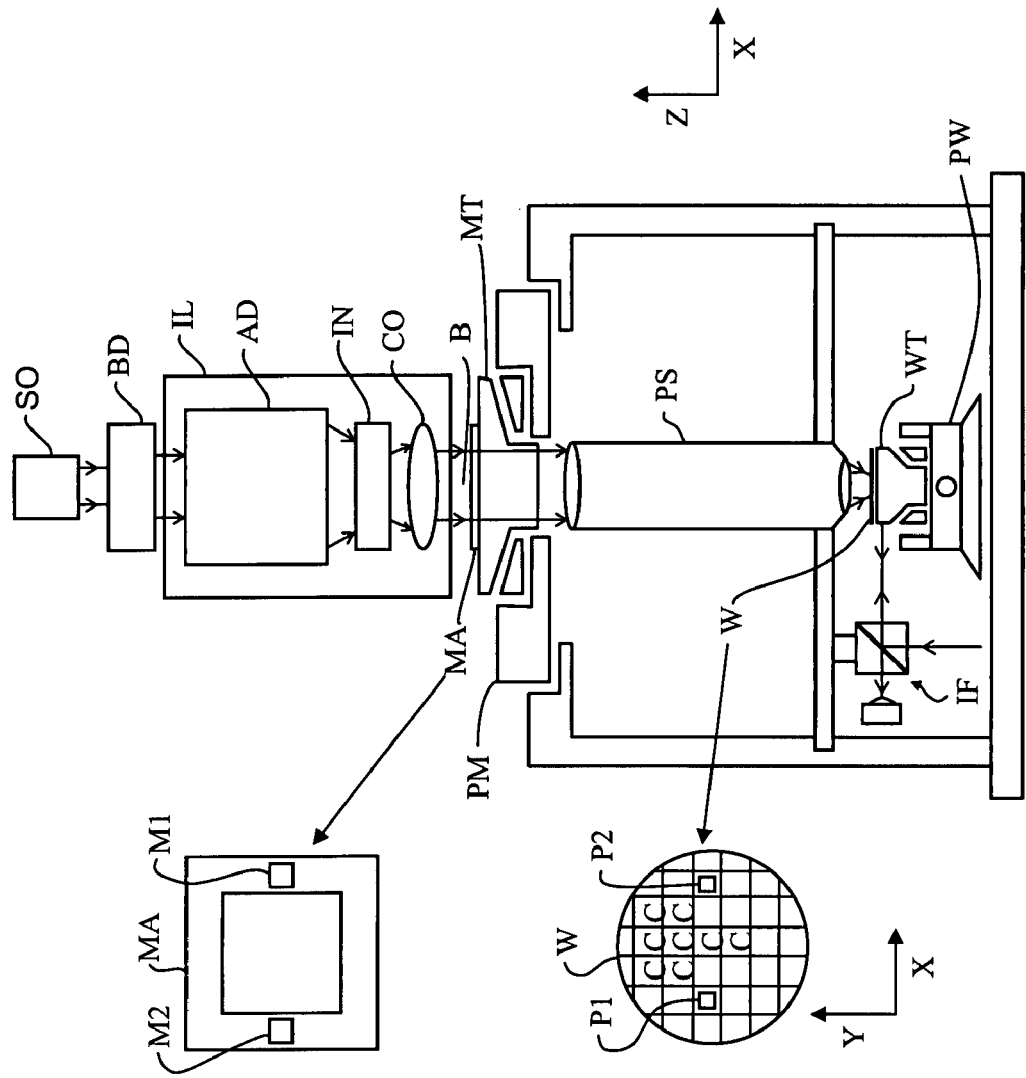
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support (e.g. a mask table) MT constructed to support a patterning device (e.g. a mask) MA and connected to a first positioning device PM configured to accurately position the patterning device in accordance with certain parameters. The apparatus also includes a substrate support (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask)

The lithographic apparatus may be of a type having two (dual stage) or more substrate supports (and/or two or more patterning device supports). In such "multiple stage" machines the additional substrate supports or patterning device supports may be used in parallel, or preparatory steps may be carried out on one or more substrate supports or patterning device supports while one or more other substrate supports or patterning device supports are being used for exposure.

The lithographic apparatus may also be of a type wherein at least a portion of the substrate may be covered by a liquid having a relatively high refractive index, e.g. water, so as to fill a space between the projection system and the substrate. A liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate support WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support MT may be realized with the aid of a long-stroke module (coarse positioning) and a short-stroke module (fine positioning), which form part of the first positioning device PM. Similarly, movement of the substrate support WT may be realized using a long-stroke module and a short-stroke module, which form part of the second positioner PW. In the case of a stepper (as opposed to a scanner) the patterning device support MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support MT and the substrate support WT are kept essentially stationary, while an entire pattern imparted to the radiation beam is projected onto a target portion C at one time (i.e. a single static exposure). The substrate support WT is then shifted in the X and/or Y direction so that a different target portion C can be exposed. In step mode, the maximum size of the exposure field limits the size of the target portion C imaged in a single static exposure.

2. In scan mode, the patterning device support MT and the substrate support WT are scanned synchronously while a pattern imparted to the radiation beam is projected onto a target portion C (i.e. a single dynamic exposure). The velocity and direction of the substrate support WT relative to the patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support MT is kept essentially stationary holding a programmable patterning device, and the substrate support WT is moved or scanned while a pattern imparted to the radiation beam is projected onto a target portion C. In this mode, generally a pulsed radiation source is employed and the programmable patterning device is updated as required after each movement of the substrate support WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
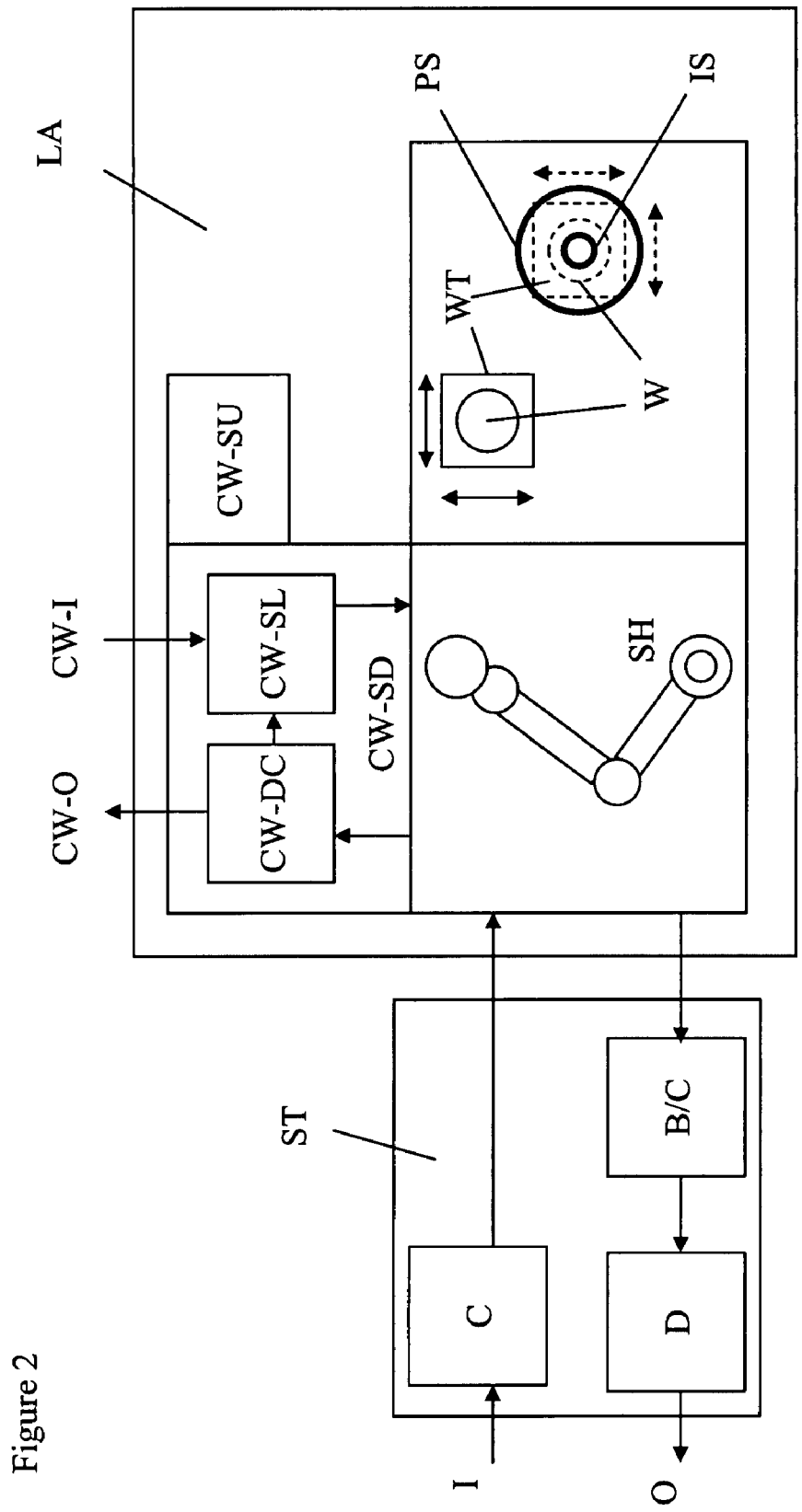
FIG. 2 depicts schematically a lithographic system according to an embodiment of the invention.

FIG. 2 shows schematically an embodiment of a lithographic system according to the invention. The lithographic system comprises a lithographic apparatus LA and a substrate track ST. The substrate track ST and lithographic apparatus LA may be integrated in a single apparatus or may be two separate apparatuses combined as one system.

The lithographic apparatus comprises a substrate handler SH. The substrate handler SH is configured to transfer substrates between the substrate track and the lithographic apparatus LA. The substrate handler SH may be a substrate robot or interface unit or any other device suitable to transfer substrates between the lithographic apparatus LA and the substrate track ST.

In the lithographic apparatus LA, the substrates are exposed to a patterned radiation beam as discussed above.

The substrate track ST is provided to produce a continuous flow of substrates to and from the lithographic apparatus, while a number of pre- and post-exposure processes are carried out with respect to these substrates. For this reason, the substrate track ST comprises a number of processing devices which are each configured to process a substrate. The substrates are introduced into the substrate track at input I. Furthermore, an output O is provided for output of substrates from the lithographic apparatus after they have been processed in the lithographic system.

In the input path of the substrate track ST, i.e. from the input I to the substrate handler SH, the substrate track comprises a coat device C. The coat device C is configured to coat a substrate with a photo-resistant or photo-sensitive coating. During exposure this coating will be exposed to a patterned radiation beam.

In the output path of the substrate track ST, i.e. from the substrate handler SH to the output O, the following processing devices are arranged: a bake and chill device B/C and a develop device D. The bake and chill device B/C is configured to bake and subsequently chill the substrate after exposure. The develop device D is configured to develop the coating after exposure so that the desired pattern comes into existence on the substrate. After development the substrate may leave the substrate track at the output O.

In an embodiment, the substrate track ST may be provided with other or further processing devices to carry out different processes before introducing the substrate into the lithographic apparatus or after exposure in the lithographic apparatus, such as a priming device, a cleaning device, a pre-bake device, inspection measurement device and/or other devices to carry out a specific treatment of the substrate.

When a batch of substrates is to be exposed by the lithographic system of FIG. 1, the flow of substrates will generally follow the following path. The flow of substrates will be introduced into the substrate track ST at the input I. Then the substrates will follow the input path crossing the coating device C. Then the substrates will be transferred by the substrate handler SH to the lithographic apparatus for exposure of each of the substrates with a patterned beam of radiation. After exposure the substrates will be transferred back to the substrate track ST by the substrate handler SH. In the output path the substrates will be baked and chilled in the bake and chill device B/C and thereafter be developed in the develop device D. After development, the substrates may leave the substrate track ST at the output O.

The lithographic apparatus LA is of the type having two substrate supports WT and an immersion system IS between the projection system PS and a substrate support WT arranged under the projection system PS. In FIG. 2, the substrate support WT arranged under the projection system is shown in dashed lines. In an immersion system, a liquid is held, in use, in an immersion space between a substrate being exposed or to be exposed and a final element of the projection system PS, for instance a lens element. However, in such a system, moving the substrate support away from the projection system to exchange the substrate for a new one, results in the liquid captured in the immersion space flowing out of this space when no further measures are taken in particular where the substrate is provided at the bottom side of the immersion space. Different arrangements have been proposed to close the immersion space after exposure in order to make possible movement of the substrate support away from the projection system without liquid running out of the immersion space.

One of these arrangements, typically for a lithographic apparatus having two (or more) substrate supports, is that when a first substrate supported by a first substrate support has moved away from the projection system, a second substrate support is moved simultaneously under the projection system while there is a relatively small gap between the first substrate support and the second substrate support. As a result, the liquid in the immersion space is substantially held within the immersion space, first between the first substrate and the projection system and thereafter between a second substrate and the projection system.

This arrangement may work well for a continuous flow of substrates through the lithographic system. Additionally or alternatively, a so-called closing substrate may be introduced in the lithographic system, which closing substrate may be introduced in the substrate track at the end of a batch of substrates to be exposed by the lithographic apparatus. The closing substrate, which has substantially the same shape and size as a process substrate, may be supported by a substrate support to close the immersion space after exposure of the batch of substrates has finished.

It may be desirable, for example, that the time in which a substrate is in contact with the liquid be as short as possible. Additionally or alternatively, the time between exposure of a substrate and the bake of the substrate in the bake processing device of the substrate track may be critical with respect to the quality of the final product. Additionally or alternatively, it may be desirable to keep the liquid in the immersion space so that exposure of a new batch of substrates can be directly started. By inserting a closing substrate, the time from end of exposure on the substrate support WT to start of bake in bake device B (post-exposure bake (PEB) time) may be kept optimal for an exposed substrate, since this substrate does not have to be used to keep the immersion space closed. Thus, product quality and/or throughput may be positively influenced.

However, a gap may occur in the flow of a batch of substrates, as will be explained hereinafter, in which case the above solution may not always suffice.

Figure 3:
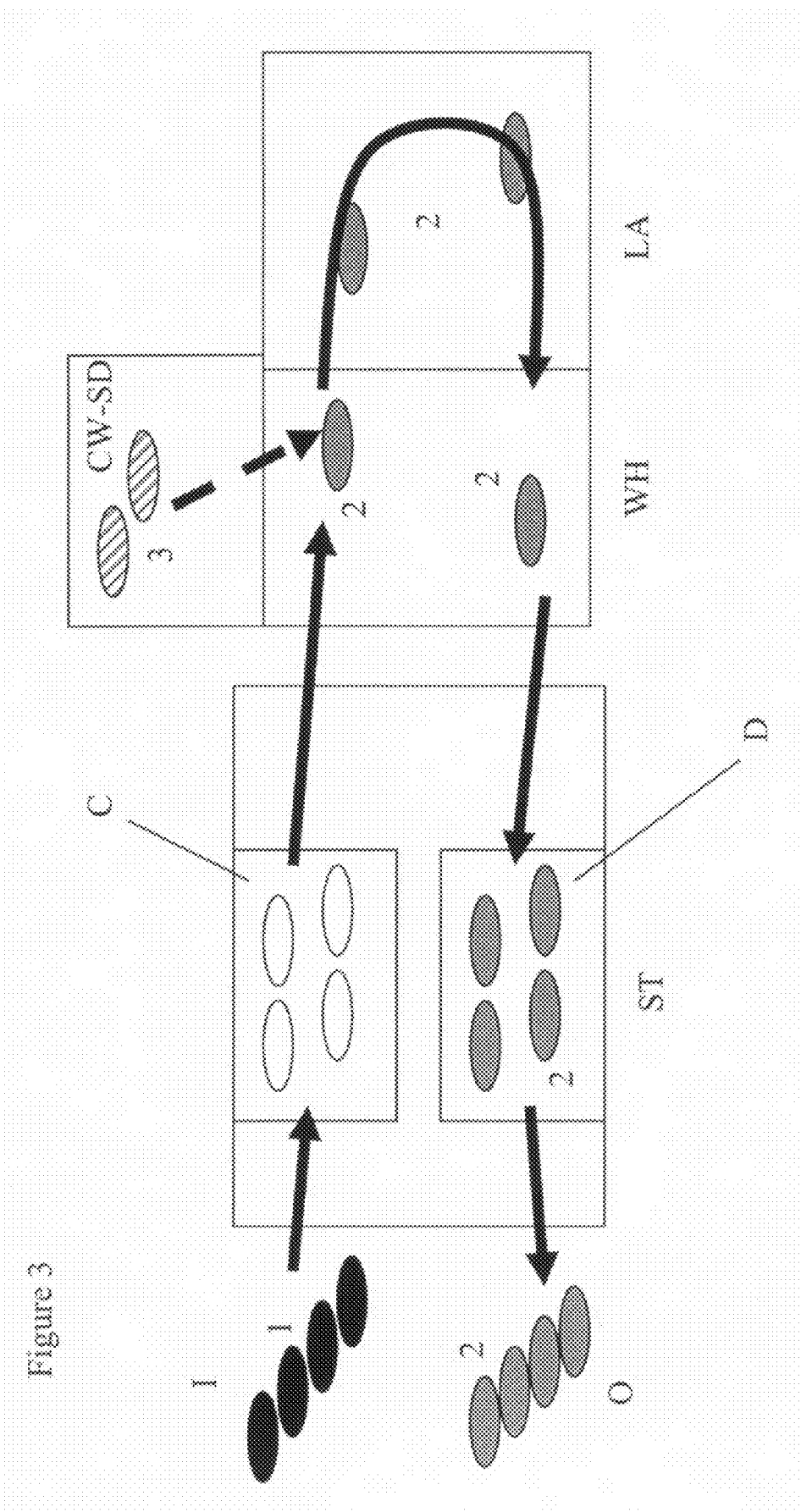
FIG. 3 depicts schematically a possible cause for the presence of a gap in a flow of substrates in a lithographic system.

FIG. 3 depicts a schematic flow of substrates through a lithographic system according to an embodiment of the invention. In FIG. 3, an example of a gap in the flow of substrates caused by a maintenance action or break-down in the substrate track ST is shown affecting the flow of substrates through the lithographic system. In this example, coat device C is taken down for maintenance or is damaged and cannot be used for a certain time. As can be seen, the substrates entering the coat device C are stopped (as represented by the dark shaded substrates) while the existing substrates in the lithographic system continue to flow through the lithographic system (as represented by the light shaded substrates). In an uncommon circumstance, all the substrates may stop in the lithographic system. Due to the coat device maintenance, a gap between substrates 1 and 2 is created which reduces the productivity of the lithographic system.

As can be understood from FIG. 3, substrate processing in the lithographic system loses productivity due to the gap between substrates 1 and 2 caused by a maintenance action or break-down in the substrate track ST. A gap should be understood to include a spacing between two substrates, in a part of the lithographic system, that exceeds a defined or accepted spacing between the substrates during processing in the referenced part of the lithographic system. Such spacing may be measured, for example, in terms of time, distance and number of process positions in the lithographic system.

Furthermore, while a gap has been described above as being caused by a maintenance action, a gap in the flow of substrate may be due to any reason. For example, a gap in the flow of substrates in at least a part of the lithographic system may be due to logistics (possibly user induced) such as untimely delivery of substrates (and other materials, e.g., masks) to the lithographic system. A gap in the flow of substrates may be caused by unscheduled downtime or interrupt in a part of the lithographic system. A gap in the flow of substrates could be caused by processing time and its variation in at least a part of the lithographic system such as due to system timing variation, a bottleneck (i.e., a part of the lithographic system always has a gap due to the operation of another part of the lithographic system) and substrate recipe (which could lead to the shift of a bottleneck from one part of the lithographic system to another).

When a gap in the flow of substrates comes into existence in the lithographic system, it is not possible to introduce a closing substrate in time via the substrate track of the lithographic system to close the immersion space, since the time required to transfer a closing substrate from the input location of the substrate track via the substrate handler to the respective substrate support is too long. Furthermore, one or more substrates of the batch of substrates may be present between the gap in the flow substrates and the input location of the substrate track, or due to a maintenance action as shown in FIG. 3, the closing substrate may not be able to pass the substrate track. Therefore, the scheduling of the loading of a closing substrate may not always be performed adequately.

As a solution, an embodiment of the present invention provides a closing substrate storage device CW-SD as depicted in FIG. 2. The closing substrate storage device CW-SD comprises a number of closing substrates which are stored in the closing substrate storage location CW-SL. When required, a closing substrate can be transferred by the substrate handler SH from the storage location to the respective substrate support WT, as indicated by a dashed arrow in FIG. 3. In this way the gap between substrates 1 and 2 may be filled by a closing substrate 3, and as a result the process substrates are not kept too long in the lithographic apparatus.

When the closing substrate is no longer required in the lithographic apparatus, the closing substrate can be transferred back to the closing substrate storage device CW-SD. The closing substrate may be returned via the closing substrate drying and/or cleaning device CW-DC which is configured to dry and/or clean the closing substrate after use. The closing substrate may be returned to the closing substrate storage location CW-SL where it can be stored until next use.

The closing substrate storage device CW-SD is integrated in the lithographic apparatus and is placed directly next to the substrate handler SH so that a closing substrate can be directly transferred to a substrate support WT so as to by-pass all substrates possibly present in the input track of the substrate track as is clear from FIG. 3. This makes a more quick and adequate loading of a closing substrate possible. As a result, a closing substrate can more easily be applied to fill in a gap in the flow of substrates through the lithographic system.

The closing substrate storage device CW-SD makes subsequent use of a closing substrate in the lithographic system possible without the need of introducing the closing substrate in the flow of substrates of the substrate track from input I to output O. As a result, a closing substrate is present close to the substrate handler SH and, when required, it can easily be transferred to one of the substrate supports WT.

The closing substrate storage device CW-SD comprises a separate input CW-I and output CW-O for introduction of a closing substrate in the lithographic system or for removal of a closing substrate out of the lithographic system. In the embodiment shown the output CW-O is connected with the closing substrate drying/cleaning device CW-DC. When, for example, it is detected that the closing substrate can not be dried and/or cleaned within the closing substrate drying/cleaning device or is damaged, the closing substrate can be taken out of the lithographic system via the output CW-O. One or more new closing substrates may be introduced into the closing substrate storage device CW-SD via the closing substrate input CW-I. In an embodiment, one or more closing substrates may be introduced via input I of the substrate track ST and taken out via output O of the substrate track ST. In such an embodiment the closing substrate input CW-I and output CW-O may be omitted.

To control the input and output of a closing substrate into or from the lithographic apparatus, the lithographic apparatus LA comprises a closing substrate scheduling unit CW-SU. The closing substrate scheduling unit CW-SU is configured to schedule the loading of a closing substrate into or out of the lithographic apparatus LA. Generally, the scheduling unit determines whether it is desired to load a closing substrate in the flow of substrates in the lithographic apparatus, for instance by detecting the presence of a gap in the flow of substrates in the lithographic system, determining whether it is desired to fill that gap with a closing substrate, and consequently, when desired, the scheduling unit automatically actuates the respective substrate handler(s) for actual introduction of the closing substrate into the flow of substrates in the lithographic system. The gap may be detected by an interface configured to determine a gap/irregularity in the input branch of the substrate track ST.

By providing an automatic scheduling unit, late introduction of a closing substrate in the flow of substrates may be avoided. Furthermore, the scheduling unit may be configured to use different criteria to determine whether the loading of a closing substrate is desired. The scheduling unit may in particular be advantageous for a lithographic system having a substrate track in which the flow of substrates can be monitored. In this way, the presence of a gap may be timely detected, and action may be taken when desired. The scheduling unit may also be used in a stand-alone lithographic apparatus, for instance to schedule loading of a closing substrate at the end of a batch of substrates or when a gap occurs due to an error in the loading of substrates into the lithographic apparatus.

In an embodiment, the loading of a closing substrate may be, for instance, based on the substrate support which is desired to be used for a process substrate, i.e. a substrate to be exposed. When for instance it is desired that only one of the two substrate supports will be used to carry a process substrate the other may continuously be loaded with a closing substrate.

In an embodiment, the closing substrate scheduling unit CW-SU may be configured to determine whether the loading of a closing substrate in the lithographic apparatus is desired on the basis of timing information of the substrate track ST and/or estimation of task durations in the substrate track and/or the lithographic apparatus. The closing substrate scheduling unit CW-SU may in such an application determine or estimate that a closing substrate is needed to fill up a gap in the flow of substrates, for instance in or at the end of a batch of substrates. Then at the right moment the closing substrate may be introduced into the system to fill up the gap as detected by the closing substrate scheduling unit. Any suitable detector configured to detect the presence of a gap in the flow of substrates may be used. A method which for instance may be used for planning of tasks in the lithographic apparatus is disclosed in U.S. Pat. No. 7,184,849, the contents of which patent is herein incorporated by reference in its entirety.

The closing substrate scheduling unit CW-SU may further or as an alternative be configured to determine whether the loading of a closing substrate in the lithographic apparatus is required in order to optimize the time a process substrate is in contact with liquid of an immersion system, to control the substrate flow in the track by filling a gap in the substrate flow, and/or to control the substrate flow at the beginning or the end of a batch of substrates.

The scheduling unit CW-SU typically comprises a microprocessor and appropriate software. The scheduling unit CW-SU is in the embodiment of FIG. 2 shown as a separate unit. However, the scheduling unit CW-SU may be integrated in another processing or control device of the substrate track ST and/or the lithographic apparatus LA, for instance a central processing and control device of the lithographic apparatus LA.

Scheduling unit CW-SU will usually comprise software to perform one or more of the methods described above. In an embodiment, software to implement one or more of the methods described above is provided on an interface between a host system of the fab and the track and lithographic apparatus of a substrate processing system in the fab. Use can be made of existing interfaces and protocols (e.g., SECS protocols and interfaces) provided by the host system and the machines of the substrate processing system.

More particularly, each step of the method may be executed on any general computer, such as a mainframe computer, personal computer or the like and pursuant to one or more, or a part of one or more, program modules or objects generated from any programming language, such as C++, Java, Fortran and the like. And still further, each step, or a file or object or the like implementing each step, may be executed by special purpose hardware or a circuit module designed for that purpose. For example, an embodiment of the invention may be implemented as a firmware program loaded into non-volatile storage or a software program loaded from or into a data storage medium as machine-readable code, such code being instructions executable by an array of logic elements such as a microprocessor or other digital signal processor.

An embodiment of the invention may be implemented as an article of manufacture comprising a computer usable medium having computer readable program code means therein for executing the method steps of the invention, a program storage device readable by a machine, tangibly embodying a program of instructions executable by a machine to perform the method steps of the invention, a computer program product, or an article of manufacture comprising a computer usable medium having computer readable program code means therein, the computer readable program code means in the computer program product comprising computer readable code means for causing a computer to execute the steps of the invention. Such an article of manufacture, program storage device, or computer program product may include, but is not limited to, CD-ROMs, diskettes, tapes, hard drives, computer system memory (e.g. RAM or ROM) and/or the electronic, magnetic, optical, biological or other similar embodiment of the program (including, but not limited to, a carrier wave modulated, or otherwise manipulated, to convey instructions that can be read, demodulated/decoded and executed by a computer). Indeed, the article of manufacture, program storage device or computer program product may include any solid or fluid transmission medium, magnetic or optical, or the like, for storing or transmitting signals readable by a machine for controlling the operation of a general or special purpose computer according to the method of an embodiment of the invention and/or to structure its components in accordance with a system of an embodiment of the invention.

An embodiment of the invention may be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another apparatus (such a cellular telephone).

The system may be specially constructed for the required purposes to perform, for example, the method steps of an embodiment of the invention or it may comprise one or more general purpose computers as selectively activated or reconfigured by a computer program in accordance with the teachings herein stored in the computer(s). The system could also be implemented in whole or in part as a hard-wired circuit or as a circuit configuration fabricated into an application-specific integrated circuit. The invention presented herein is not inherently related to a particular computer system or other apparatus. The required structure for a variety of these systems will appear from the description given.

The above embodiment of a lithographic system according to the invention comprises a closing substrate storage device configured to load a closing substrate in the flow of substrates in the lithographic apparatus. A similar or the same storage device may be used for the storage of one or more other types of utility substrate such as one or more calibration, dummy or maintenance substrates. In other words, the lithographic apparatus may comprise a utility substrate storage device to store of one or more utility substrates which may comprise a single type or a plurality of different types of utility substrate, such as one or more calibration substrates, one or more dummy substrates, one or more maintenance substrates and/or one or more closing substrates. The scheduling unit may be configured to schedule the loading of any type of utility substrate in the flow of substrates in the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a patterning device support constructed to hold a patterning device, the patterning device being capable of imparting the radiation beam with a pattern in its cross-section to form a patterned radiation beam;
   a substrate support constructed to hold a substrate;
   a projection system configured to project the patterned radiation beam onto a target portion of the substrate;
   a utility substrate storage device configured to hold a utility substrate, the utility substrate storage device being integrated with the lithographic apparatus and separate from a substrate track associated with the lithographic apparatus;
   a utility substrate scheduling unit configured to schedule the loading of a utility substrate in a flow of substrates in the lithographic apparatus; and
   a substrate handler configured to transfer a utility substrate from the utility substrate storage device to the substrate support and/or from the substrate support to the utility substrate storage device,
   wherein, in use, transfer of the utility substrate from the substrate support to the utility substrate storage device and/or from the utility substrate storage device to the substrate support is effected without loading the utility substrate to or unloading the utility substrate from the substrate track.

2. The lithographic apparatus of claim 1, wherein the scheduling unit is configured to schedule the loading of a utility substrate in order to load a process substrate on a selected substrate support.

3. The lithographic apparatus of claim 1, wherein the scheduling unit is configured to schedule the loading of a utility substrate on the basis of timing information of the substrate track associated with the lithographic apparatus and/or estimation of task durations in the substrate track or the lithographic apparatus.

4. The lithographic apparatus of claim 1, wherein the scheduling unit is configured to schedule the loading of a utility substrate in order to optimize one or more selected from the following group:
   a time a process substrate is in contact with liquid of an immersion system of the lithographic apparatus,
   control of the flow of substrates by filling a gap in the flow of substrates,
   control of the flow of substrates at a beginning or an end of a batch of process substrates, and/or
   control a post exposure delay time between end of exposure and transfer to a substrate track.

5. The lithographic apparatus of claim 1, wherein the scheduling unit is configured to schedule the loading of a utility substrate at the start of a new batch of substrates to warm-up and/or calibrate the lithographic apparatus before loading process substrates.

6. The lithographic apparatus of claim 1, comprising two substrate supports and an immersion system configured to provide a liquid between the projection system and a substrate supported on one of the two substrate supports, and wherein the utility substrate comprises a closing substrate intended to be used to close an immersion liquid space of the immersion system.

7. The lithographic apparatus of claim 1, wherein the utility substrate storage device comprises a drying unit and/or cleaning unit configured to dry and/or clean a utility substrate after use in a flow of substrates.

8. The lithographic apparatus of claim 1, wherein the utility substrate scheduling unit is integrated in a central control device of the lithographic apparatus.

9. The lithographic apparatus of claim 1, wherein the utility substrate scheduling unit comprises a detection device to monitor the flow of substrates in the lithographic apparatus and/or a substrate track associated with the lithographic apparatus.

10. A lithographic system comprising:
   a substrate track comprising one or more processing devices configured to process substrates; and
   a lithographic apparatus comprising:
     a substrate support constructed to hold a substrate,
     a utility substrate storage device configured to hold a utility substrate, the utility substrate storage device being integrated with the lithographic apparatus and separate from the substrate track, a utility substrate scheduling unit configured to schedule the loading of a utility substrate in a flow of substrates in the lithographic apparatus, and a substrate handler configured to transfer a utility substrate from the utility substrate storage device to the substrate support and/or from the substrate support to the utility substrate storage device;

wherein the substrate handler or a further substrate handler is configured to transfer a substrate between the lithographic apparatus and the substrate track, and wherein, in use, transfer of the utility substrate from the substrate support to the utility substrate storage device and/or from the utility substrate storage device to the substrate support is effected without loading the utility substrate to or unloading the utility substrate from the substrate track.

11. A computer-implemented method of scheduling the loading of a utility substrate in a flow of substrates in a lithographic apparatus, comprising:

detecting with a detector a gap in the flow of substrates in or towards the lithographic apparatus;

determining with a processor whether the loading of a utility substrate in the gap is desired, and when desired, scheduling the loading of a utility substrate in the flow of substrates to fill the gap, wherein the scheduling includes transferring the utility substrate from a utility substrate storage device integrated with the lithographic apparatus to a substrate support of the lithographic apparatus without loading the utility substrate to or unloading the utility substrate from a substrate track associated with the lithographic apparatus.

12. The method of claim 11, wherein the loading of a utility substrate is scheduled in order to load a process substrate on a selected substrate support.

13. The method of claim 12, wherein the loading of a utility substrate is determined on the basis of timing information of a substrate track associated with the lithographic apparatus and/or estimation of task durations in the substrate track or the lithographic apparatus.

14. The method of claim 11, wherein the loading of a utility substrate is determined in order to optimize one or more selected from the following group:

a time a process substrate is in contact with liquid of an immersion system of the lithographic apparatus, the control of the flow of substrates by filling a gap in the flow of substrates, the control of the flow of substrates at a beginning or an end of a batch of process substrates, and/or the control of a post exposure delay time between end of exposure and transfer to a substrate track.

15. The method of claim 11, wherein the loading of a utility substrate is scheduled at the start of a new batch of substrates to warm-up and/or calibrate the lithographic apparatus before loading process substrates.

16. A non-transitory machine readable medium including software codes to schedule the loading of a utility substrate in a flow of substrates in a lithographic apparatus, the machine readable medium comprising:

software code configured to detect a gap in a flow of substrates in or towards the lithographic apparatus;

software code configured to determine whether the loading of a utility substrate in the gap is desired; and software code configured to schedule, when desired, the loading of a utility substrate in the flow of substrates to fill the gap, wherein the software code configured to schedule, when desired, the loading of a utility substrate in the flow of substrates to fill the gap is further configured to transfer the utility substrate from a utility substrate storage device integrated with the lithographic apparatus to a substrate support of the lithographic apparatus without loading the utility substrate to or unloading the utility substrate from a substrate track associated with the lithographic apparatus.

17. The non-transitory machine readable medium of claim 16, wherein the software code is configured to schedule the loading of a utility substrate in order to load a process substrate on a selected substrate support.

18. The non-transitory machine readable medium of claim 16, wherein the software code is configured to determine the loading of a utility substrate on the basis of timing information of a substrate track associated with the lithographic apparatus and/or estimation of task durations in the substrate track or the lithographic apparatus.

19. The non-transitory machine readable medium of claim 16, wherein the software code is configured to determine the loading of a utility substrate in order to optimize one or more selected from the following group:

a time a process substrate is in contact with liquid of an immersion system of the lithographic apparatus, the control of the flow of substrates by filling a gap in the flow of substrates, the control of the flow of substrates at a beginning or an end of a batch of process substrates, and/or the control of a post exposure delay time between end of exposure and transfer to a substrate track.

20. The non-transitory machine readable medium of claim 16, wherein the software code is configured to schedule the loading of a utility substrate at the start of a new batch of substrates to warm-up and/or calibrate the lithographic apparatus before loading process substrates.

21. The method of claim 11, wherein detecting a gap includes measuring the gap.

22. The method of claim 16, wherein the software code configured to detect the gap is configured to measure the gap.

* * * * *